US012166163B2

(12) United States Patent
Jeon et al.

(10) Patent No.: US 12,166,163 B2
(45) Date of Patent: Dec. 10, 2024

(54) SHEET DISPOSED BELOW PANEL, AND DISPLAY DEVICE INCLUDING THE SAME

(71) Applicant: SAMSUNG DISPLAY CO., LTD., Yongin-si (KR)

(72) Inventors: Jae-Hwan Jeon, Seongnam-si (KR); Byung-Gon Kum, Hwaseong-si (KR); Da Woon Kim, Asan-si (KR); Do Hun Kim, Suwon-si (KR); Hyun Su Park, Hwaseong-si (KR); Ji Sang Seo, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 298 days.

(21) Appl. No.: 17/732,598

(22) Filed: Apr. 29, 2022

(65) Prior Publication Data

US 2023/0061014 A1 Mar. 2, 2023

(30) Foreign Application Priority Data

Aug. 25, 2021 (KR) .......................... 10-2021-0112315

(51) Int. Cl.
*H01L 33/64* (2010.01)
*B32B 7/12* (2006.01)
(Continued)

(52) U.S. Cl.
CPC .............. *H01L 33/644* (2013.01); *B32B 7/12* (2013.01); *B32B 27/08* (2013.01); *B32B 27/36* (2013.01);
(Continued)

(58) Field of Classification Search
CPC . H01L 33/644; H01L 33/641; H01L 23/3733; B32B 7/12; B32B 27/08;
(Continued)

(56) References Cited

U.S. PATENT DOCUMENTS

| 10,673,012 B2 * | 6/2020 | Kim ........................ B32B 27/32 |
| 2016/0268523 A1 * | 9/2016 | Kim ....................... H10K 77/10 |

(Continued)

FOREIGN PATENT DOCUMENTS

| KR | 10-0882606 | 2/2009 |
| KR | 10-1499887 | 3/2015 |

(Continued)

OTHER PUBLICATIONS

Zhang Jiaqin; Lu Xu; Gong Qing, "Display Apparatus, and Display Module and Manufacturing Method Therefor", Dec. 8, 2022, Boe Technology Group Co Ltd; Chengdu Boe Optoelect Tech Co, Entire Document (Translation of WO 2022252081). (Year: 2022).*

*Primary Examiner* — Stephen S Sul
(74) *Attorney, Agent, or Firm* — F. CHAU & ASSOCIATES, LLC

(57) ABSTRACT

A lower sheet disposed below a display panel includes a heat radiation layer having a first side and a second side facing the first side. A first film layer is disposed on the first side of the heat radiation layer. A second film layer is disposed on the second side of the heat radiation layer. A first resin layer is disposed between the heat radiation layer and the first film layer. A second resin layer is disposed between the heat radiation layer and the second film layer. A sealing layer is disposed on lateral sides of the heat radiation layer. The sealing layer directly contacts an entirety of the lateral sides of the heat radiation layer, and directly contacts at least a portion of lateral sides of the first resin layer and the second resin layer.

18 Claims, 8 Drawing Sheets

(51) Int. Cl.
*B32B 27/08* (2006.01)
*B32B 27/36* (2006.01)
*H01L 51/52* (2006.01)
*H10K 50/87* (2023.01)
*H01L 25/075* (2006.01)

(52) U.S. Cl.
CPC ........... *H01L 33/641* (2013.01); *H10K 50/87* (2023.02); *B32B 2255/10* (2013.01); *B32B 2255/20* (2013.01); *B32B 2307/30* (2013.01); *B32B 2457/20* (2013.01); *H01L 25/0753* (2013.01); *H01L 2933/0075* (2013.01)

(58) Field of Classification Search
CPC . B32B 27/36; B32B 2255/10; B32B 2255/20; B32B 2307/30; B32B 2457/20; H10K 59/8794; H05K 7/20954; H05K 7/20481; H05K 7/20454; H05K 7/20472; H05K 7/20963; F28F 13/18; F28F 2245/06; F28F 21/02

See application file for complete search history.

(56) References Cited

U.S. PATENT DOCUMENTS

| | | | |
|---|---|---|---|
| 2018/0039372 A1* | 2/2018 | Cho | G06F 3/0446 |
| 2018/0190916 A1* | 7/2018 | Kim | H10K 50/865 |
| 2019/0012007 A1* | 1/2019 | Kim | G06F 1/1626 |
| 2020/0194712 A1* | 6/2020 | Choi | H10K 59/12 |
| 2020/0266368 A1* | 8/2020 | Park | B32B 7/12 |
| 2023/0020481 A1* | 1/2023 | Qin | H05K 7/20 |

FOREIGN PATENT DOCUMENTS

| | | | |
|---|---|---|---|
| KR | 10-2156653 | 9/2020 | |
| WO | WO-2022252081 A1 * | 12/2022 | H10K 59/8794 |

* cited by examiner

SHEET DISPOSED BELOW PANEL, AND DISPLAY DEVICE INCLUDING THE SAME

CROSS-REFERENCE TO RELATED APPLICATION

This application claims priority under 35 U.S.C. § 119 to Korean Patent Application No. 10-2021-0112315 filed in the Korean Intellectual Property Office on Aug. 25, 2021, the entire contents of which are incorporated herein by reference.

1. TECHNICAL FIELD

The present disclosure relates to a sheet disposed below a panel and a display device including the sheet disposed below a panel.

2. DISCUSSION OF RELATED ART

Emissive display devices provide increased luminance, driving voltages, and response speed characteristics, and allow multiple colors. Therefore, emissive display devices are applied to various categories of products including smartphones, monitors, and TVs.

The emissive display device includes a display panel having a light-emitting device. The light-emitting device includes a cathode and an anode that are disposed on an emission layer. In response to a voltage that is applied to the electrodes, the emission layer connected to the electrodes emits light.

In instances in which the light-emitting device or a driving chip for driving the light-emitting device generates excessive heat, elements may be damaged. To protect the elements from such risks, a functional sheet with a radiating or buffering function may be attached to a lower side of the display panel.

SUMMARY

Embodiments of the present disclosure provide a lower sheet below a display panel from which an air pocket is removed, and a display device including the lower sheet.

Embodiments of the present disclosure are not limited to the effects mentioned above, and other technical aspects may be clearly understood by those skilled in the art from the description provided below.

According to an embodiment of the present disclosure, a lower sheet disposed below a display panel includes a heat radiation layer having a first side and a second side facing the first side. A first film layer is disposed on the first side of the heat radiation layer. A second film layer is disposed on the second side of the heat radiation layer. A first resin layer is disposed between the heat radiation layer and the first film layer. A second resin layer is disposed between the heat radiation layer and the second film layer. A sealing layer is disposed on lateral sides of the heat radiation layer. The sealing layer directly contacts an entirety of the lateral sides of the heat radiation layer, and directly contacts at least a portion of lateral sides of the first resin layer and the second resin layer.

In an embodiment, the sealing layer may directly contact at least a portion of lateral sides of the first film layer and the second film layer.

In an embodiment, the heat radiation layer may include graphite.

In an embodiment, the first film layer and the second film layer may include a PET.

In an embodiment, the lower sheet may further include a releasing layer disposed on one side of the second film layer.

According to an embodiment of the present disclosure, a lower sheet below a display panel, includes a heat radiation layer including graphite. The heat radiation layer has a first side and a second side facing the first side. A first film layer is disposed on the first side of the heat radiation layer. A second film layer is disposed on the second side of the heat radiation layer. A first resin layer is disposed between the heat radiation layer and the first film layer. A second resin layer is disposed between the heat radiation layer and the second film layer. The first resin layer and the second resin layer together direct contact an entirety of lateral sides of the heat radiation layer.

In an embodiment, the first resin layer and the second resin layer may seal the lateral sides of the heat radiation layer.

In an embodiment, an end of the first resin layer may be bonded to an end of the second resin layer.

In an embodiment, the first resin layer and the second resin layer may be bonded along an edge of the heat radiation layer.

In an embodiment, the first film layer and the second film layer may be bonded to the first resin layer and the second resin layer along an edge of the heat radiation layer.

In an embodiment, the lateral side of the heat radiation layer may form a right angle with an upper side of the heat radiation layer.

In an embodiment, one lateral side of the heat radiation layer may include a first lateral side and a second lateral side inclined with respect to an upper side of the heat radiation layer.

In an embodiment, the first film layer and the second film layer may include a PET.

According to an embodiment of the present disclosure, a display device includes a display panel. A lower sheet overlaps the display panel. The lower sheet includes a heat radiation layer including graphite, the heat radiation layer having a first side and a second side facing the first side. A first film layer is disposed on the first side of the heat radiation layer. A second film layer is disposed on the second side of the heat radiation layer. A first resin layer is disposed between the heat radiation layer and the first film layer. A second resin layer is disposed between the heat radiation layer and the second film layer. A sealing layer is disposed on lateral sides of the heat radiation layer. The sealing layer directly contacts an entirety of the lateral side of the heat radiation layer, and directly contacts at least a portion of lateral sides of the first resin layer and the second resin layer.

In an embodiment, the sealing layer may directly contact at least a portion of lateral sides of the first film layer and the second film layer.

In an embodiment, the display device may further include a releasing layer disposed between one side of the second film layer and the display panel.

According to an embodiment of the present disclosure, a display device includes a display panel. A lower sheet overlaps the display panel. The lower sheet includes a heat radiation layer including graphite. The heat radiation layer has a first side and a second side facing the first side. A first film layer is disposed on the first side of the heat radiation layer. A second film layer is disposed on the second side of the heat radiation layer. A first resin layer is disposed between the heat radiation layer and the first film layer. A second resin layer is disposed between the heat radiation layer and the second film layer. The first resin layer and the second resin layer together directly contact an entirety of lateral sides of the heat radiation layer.

In an embodiment, the first resin layer and the second resin layer may seal the lateral side of the heat radiation layer.

In an embodiment, the first film layer and the second film layer may be bonded along an edge of the heat radiation layer.

In an embodiment, the lateral side of the heat radiation layer may include a first lateral side and a second lateral side inclined with respect to an upper side of the heat radiation layer.

According to embodiments of the present disclosure, the sheet disposed below a panel from which the air pocket is removed may be provided. The vapor defects generated by the air pocket may be prevented. The display device with increased reliability and quality by providing the sheet disposed below a panel with excellent quality.

DETAILED DESCRIPTION OF EMBODIMENTS

Figure 1A:
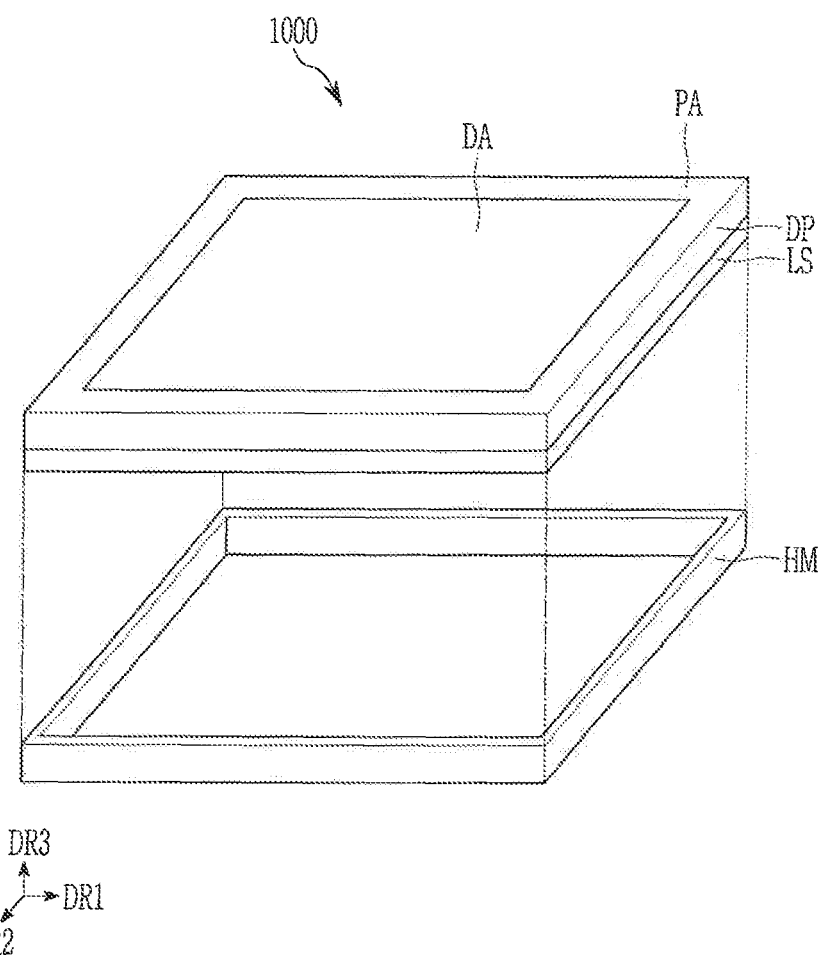
FIG. 1A shows an exploded perspective view of a display device according to an embodiment of the present disclosure.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

Parts that are irrelevant to the description may be omitted to clearly describe the present disclosure, and the same elements will be designated by the same reference numerals throughout the specification.

The size and thickness of each configuration shown in the drawings are arbitrarily shown for better understanding and ease of description, but the present disclosure is not limited thereto. In the drawings, the thickness of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

Figure 1B:
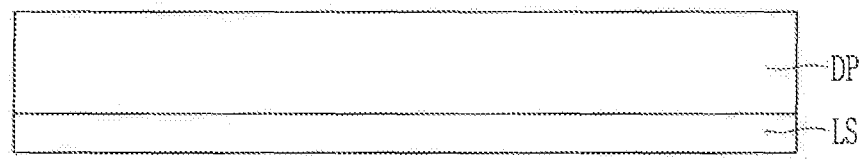
FIG. 1B shows a cross-sectional view of a display panel and a lower sheet according to an embodiment of the present disclosure.
Figure 2:
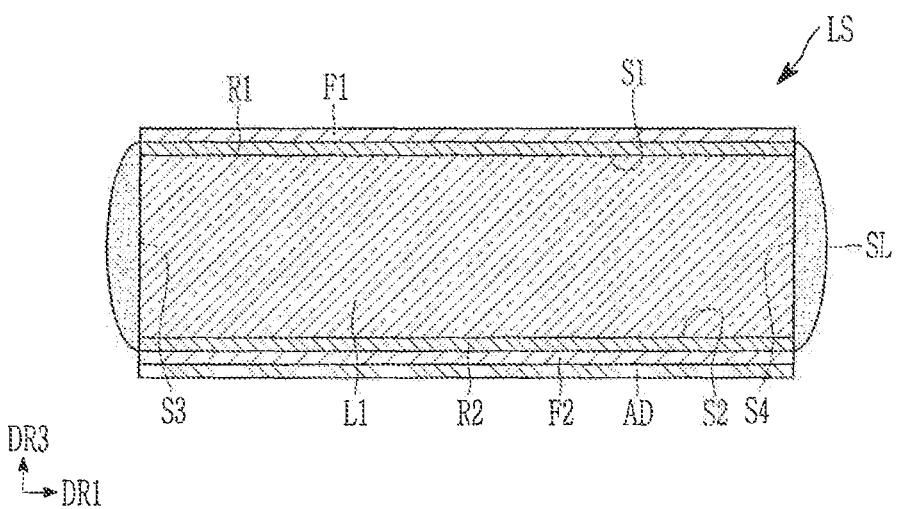
FIGS. 2-4 respectively show a cross-sectional view of a lower sheet according to embodiments of the present disclosure.

A display device according to an embodiment, and a sheet disposed below a panel included by the display device, will now be described with reference to FIG. 1A to FIG. 2. FIG. 1A shows an exploded perspective view of a display device according to an embodiment, and FIG. 1B shows a cross-sectional view of a display panel and a sheet disposed below a panel according to an embodiment. FIG. 2 shows a cross-sectional view of a sheet disposed below a panel according to an embodiment.

Referring to FIG. 1A, the display device 1000 according to an embodiment includes a display panel DP, a lower sheet LS disposed below the display panel, and a housing HM.

A first side of the display panel DP for displaying images is parallel to a side defined in a first direction DR1 and a second direction DR2. A normal line direction of the first side on which the images are displayed, that is, a thickness direction of the display panel DP, is indicated by a third direction DR3. Front sides (e.g., upper sides) and rear sides (e.g., lower sides) of respective members are distinguished by the third direction DR3. However, the directions indicated by the first to third directions DR1, DR2, and DR3 are relative concepts and they may be changed to other directions. Additionally, the first to third directions DR1, DR2, DR3 may cross each other in various different angles.

In an embodiment, the display panel DP may be a flat rigid display panel. However, embodiments of the present disclosure are not limited thereto. For example, in an embodiment, the display panel DP may be a flexible display panel. In an embodiment, the display panel DP may be an organic light emitting panel using an organic light emitting element. However, embodiments of the present disclosure are not limited thereto. For example, in an embodiment, the display panel DP may be an inorganic emissive display device using a micro light emitting diode or an inorganic semiconductor (e.g., an inorganic light emitting diode).

The display panel DP includes a display area DA for displaying images, and a non-display area PA provided adjacent to the display area DA. The non-display area PA displays no images. For example, in an embodiment, the display area DA may have a quadrangular shape, and the non-display area PA may have a shape for surrounding the display area DA. For example, the non-display area PA may completely surround the display area DA (e.g., in the first and/or second directions DR1, DR2). However, embodiments of the present disclosure are not limited thereto. For example, in an embodiment, the non-display area PA may not surround the display area DA on one or more sides. While the shape of the display area DA and the non-display area PA are quadrangular in FIG. 1A, embodiments of the present disclosure are not limited thereto. The shapes of the display area DA and the non-display area PA may be relatively designed to have various different shapes.

The housing HM provides a predetermined internal space. The display panel DP is mounted in the housing HM. In an embodiment, various types of electronic parts, for example, a power supply, a storage device, and/or a voice input/output module in addition to the display panel DP may be mounted in the housing HM.

Referring to FIG. 1A and FIG. 1B, a lower sheet LS may be positioned beneath the display panel DP (e.g., in the third direction DR3).

The lower sheet LS functions to radiate heat. For this purpose, the lower sheet L) may include a layer with high thermal conductivity such as graphite. Without being limited thereto, the lower sheet LS may include a metal layer such as silver (Ag), copper (Cu), and/or aluminum (Al).

The lower sheet LS may have substantially the same size as the display panel (DP) and may overlap the display panel (DP). A lateral side of the lower sheet LS and a lateral side of the display panel (DP) may be arranged, and are not limited thereto. The lower sheet LS may perform a heat radiating function, an electromagnetic wave shielding function, a grounding function, a buffering function, an intensity reinforcing function, and/or a digitizing function.

The lower sheet LS will now be described in detail with reference to FIG. 2.

The lower sheet LS may include a heat radiation layer L1, first and second resin layers R1 and R2, first and second film layers F1 and F2, a releasing layer AD, and a sealing layer SL.

In an embodiment, the heat radiation layer L1 may have a plate shape. For example, the heat radiation layer L1 may have a similar shape to the display panel DP. However, embodiments of the present disclosure are not limited thereto and the heat radiation layer L1 may have various different shapes, such as depending on the form of the display panel DP.

In an embodiment, the heat radiation layer L1 may include graphite or carbon nanotubes. However, embodiments of the present disclosure are not limited thereto. For example, in an embodiment, the heat radiation layer L1 may include a thin film of metal such as copper or silver.

The heat radiation layer L1 may include graphite. In an embodiment, the graphite may be obtained by coating a graphene oxide paste on a releasing film layer such as a polyethylene terephthalate (PET), reducing the same by increasing a temperature, crystallizing the reduced graphite, and removing the releasing film layer from the crystallized graphite. However, embodiments of the present disclosure are not limited thereto and the graphite is not limited to the above-noted manufacturing method.

In an embodiment, the heat radiation layer L1 may prevent heat generated by a plurality of parts, such as an application chip, a camera, a battery component, etc., from reaching the display panel DP or radiate the heat generated by the display panel DP.

The lower sheet LS may include a first resin layer R1 positioned on a first side S1 of the heat radiation layer L1, and a second resin layer R2 positioned on a second side S2 of the heat radiation layer L1. In an embodiment, the first side S1 may be an upper side of the heat radiation layer L1 (e.g., in the third direction DR3), and the second side S2 may be a bottom surface of the heat radiation layer L1 (e.g., in the third direction DR3). The first side S1 may be parallel to the second side S2.

In an embodiment, the first resin layer R1 and the second resin layer R2 may have a same planar shape as the heat radiation layer L1. For example, the first resin layer R1 and the second resin layer R2 may have a same area (e.g., in a plane defined in the first and second directions DR1, DR2) as the heat radiation layer L1. The first resin layer R1 and the second resin layer R2 may have edges arranged to be aligned with the edge of the heat radiation layer L1. The present specification shows an embodiment in which the edges of the first resin layer R1 and the second resin layer R2 completely correspond to (e.g., are aligned with) the edge of the heat radiation layer L1. However, embodiments of the present disclosure are not limited thereto and one or more edges of the first resin layer R1 and/or the second resin layer R2 may not be aligned with the edge of the heat radiation layer L1, such as an embodiment that includes a manufacturing error, etc.

In an embodiment, the first resin layer R1 and the second resin layer R2 may be hot melt adhesive layers. The hot melt adhesive layer may be formed by a hot melt adhesive that is hardened. In an embodiment, the hot melt adhesive may include a thermoplastic resin. For example, the hot melt adhesive may be softened in a high temperature condition caused by external heat, and may be hardened in a low temperature condition. For example, as the hot melt adhesive is hardened at the high temperature condition, its adherence may become relatively weak, and as it is hardened at the low temperature condition, its adherence may become relatively strong.

A first film layer F1 may be positioned on (e.g., disposed on) the first resin layer R1, and a second film layer F2 may be positioned on (e.g., disposed on) the second resin layer R2. The first resin layer R1 may be positioned between the first film layer F1 and the heat radiation layer L1 (e.g., in the third direction DR3), and the second resin layer R2 may be positioned between the second film layer F2 and the heat radiation layer L1 (e.g., in the third direction DR3). The first film layer F1 may be combined to (e.g., attached or adhered to) the heat radiation layer L1 by the first resin layer R1, and the second film layer F2 may be combined to (e.g., attached or adhered to) the heat radiation layer L1 by the second resin layer R2.

In an embodiment, the first film layer F1 and the second film layer F2 may have a same planar shape as the heat radiation layer L1. The first film layer F1 and the second film layer F2 may have a same planar area (e.g., in a plane defined in the first and second directions DR1, DR2) as the heat radiation layer L1. The first film layer F1 and the second film layer F2 may have edges arranged to be aligned with the edge of the heat radiation layer L1. The present specification shows an embodiment in which the edges of the first film layer F1 and the second film layer F2 completely correspond to (e.g., are aligned with) the edge of the heat radiation layer L1. However, embodiments of the present disclosure are not limited thereto and one or more edges of the first film layer F1 and/or the second film layer F2 may not be aligned with the edge of the heat radiation layer L1, such as an embodiment that includes a manufacturing error, etc.

According to an embodiment, the edges of the heat radiation layer L1, the first resin layer R1, the second resin layer R2, the first film layer F1, and the second film layer F2 may have arranged forms. The lateral sides of the heat radiation layer L1, the first resin layer R1, the second resin layer R2, the first film layer F1, and the second film layer F2 may configure one side.

In an embodiment, the first film layer F1 and the second film layer F2 may include at least one compound selected from a polyethylene terephthalate (PET), polyimide (PI), polycarbonate (PC), polyethylene (PE), polypropylene (PP), polysulfone (PSF), polymethyl methacrylate (PMMA), triacetyl cellulose (TAC), and a cyclic olefin polymer (COP). However, embodiments of the present disclosure are not limited thereto.

A sealing layer SL is positioned on the lateral sides S3 and S4 of the heat radiation layer L1. In an embodiment, the sealing layer SL may completely seal the lateral sides S3 and S4 of the heat radiation layer L1. In an embodiment, the sealing layer SL may be made of a sealant or a frit. However, embodiments of the present disclosure are not limited thereto.

The sealing layer SL may directly contact an entirety of the lateral sides S3 and S4 of the heat radiation layer L1. No other spaces are disposed between the sealing layer SL and the lateral sides S3 and S4 of the heat radiation layer L1.

The sealing layer SL may directly contact at least a portion of the lateral sides of the first resin layer R1 and the second resin layer R2 in addition to the heat radiation layer L1. The sealing layer SL may directly contact at least a portion of the lateral sides of the first film layer F1 and the second film layer F2. However, embodiments of the present disclosure are not limited thereto. For example, the sealing layer SL may directly contact an entirety of the lateral sides of the first resin layer R1, the second resin layer R2, the first film layer F1, and the second film layer F2. In an embodiment, the sealing layer SL may directly contact at least a portion of the lateral sides of the first resin layer R1 and the second resin layer R2, and may not directly contact the lateral sides of the first film layer F1 and the second film layer F2.

The lower sheet LS may further include a releasing layer AD overlapping the second side S2 of the heat radiation layer L1 (e.g., in the third direction DR3). The releasing layer AD may be disposed on the second film layer F2. For example, in an embodiment, the releasing layer AD may be disposed directly on the second film layer F2. The releasing layer AD protects one side of the lower sheet LS. In an embodiment, the releasing layer AD may include an additional cover film layer, and may be combined to another constituent element (e.g., a display panel) by removing the additional cover film layer.

In an embodiment, the releasing layer AD may include a polyethylene terephthalate (PET), polycarbonate (PC), polyimide (PI), or paper. In an embodiment, a silicon solution may be applied to an upper side of one layer or a releasing coating layer including a silicon-based resin may be formed to increase the releasing force of the releasing layer AD. However, embodiments of the present disclosure are not limited thereto.

With respect to the lower sheet LS, the sealing layer SL is completely bonded to an entirety of the edges of the heat radiation layer L1, and a separation space therebetween may be removed. In comparative embodiments in which there is an additional space between the heat radiation layer L1 and the sealing layer SL, vapor defects may be generated from the separation space in a subsequent process performed in a high temperature and high pressure condition. For example, the space between the heat radiation layer L1 and the sealing layer SL may work as an internal remaining pressure and may generate the vapor defect of the lower sheet LS. However, in an embodiment of the present disclosure, the sealing layer SL is bonded to an entirety of the lateral sides S3, S4 of the heat radiation layer L1 and there is no additional space therebetween. Therefore, the generation of vapor defects are prevented in the subsequent process in the high temperature and high pressure condition, and the lower sheet has increased quality and reliability.

Figure 3:
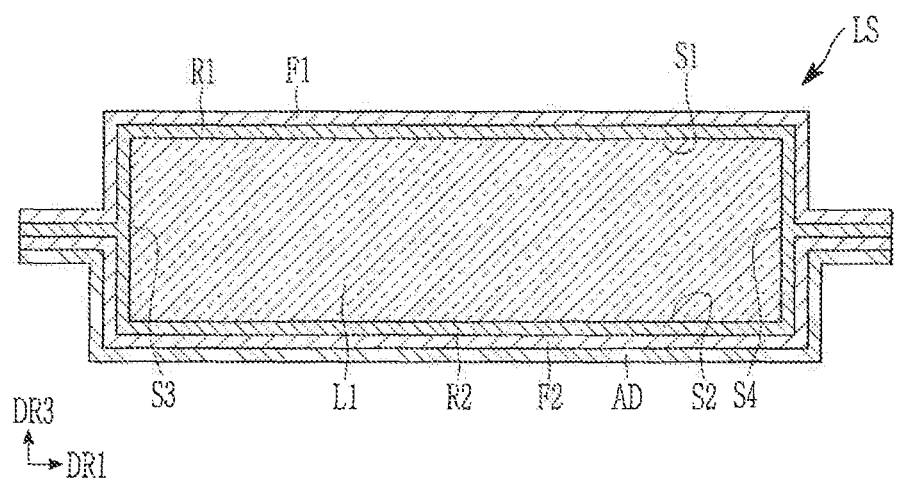
Figure 4:
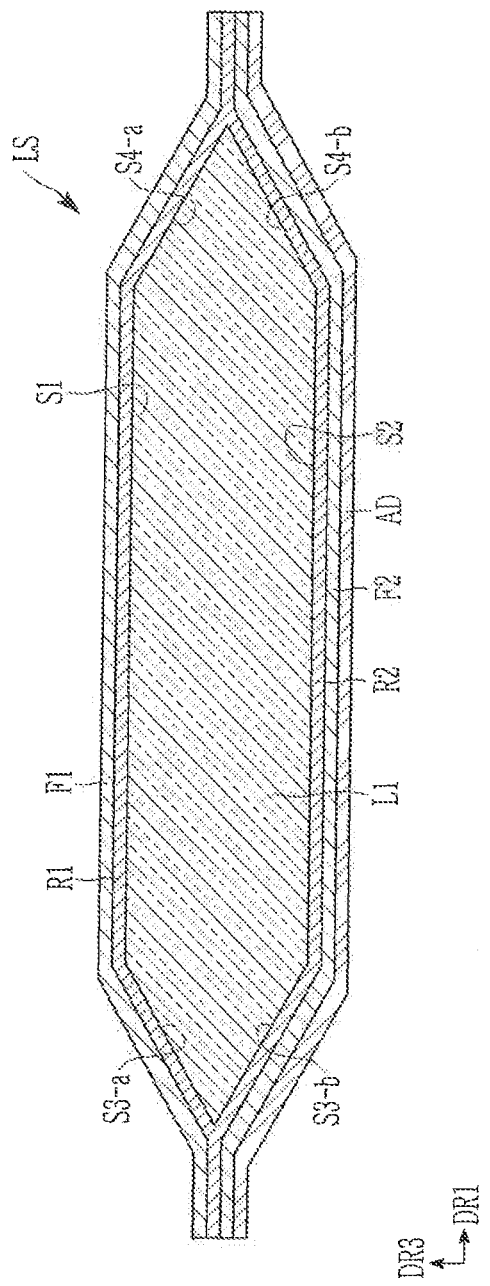

A lower sheet according to an embodiment will now be described with reference to FIG. 3 and FIG. 4. FIG. 3 and FIG. 4 respectively show a cross-sectional view of a sheet disposed below a panel according to embodiments of the present disclosure. A description of the same constituent elements as the above-described constituent elements may be omitted for convenience of explanation.

Referring to FIG. 3, the lower sheet LS includes a heat radiation layer L1, a first resin layer R1, a second resin layer R2, a first film layer F1, a second film layer F2, and a releasing layer AD.

In an embodiment, the lateral sides S3, S4 of the heat radiation layer L1 may form right angles with first and second sides S1, S2 (e.g., upper and lower sides) of the heat radiation layer L1. The first resin layer R1 and the second resin layer R2 may be bonded along the edge of the heat radiation layer L1. For example, the first resin layer R1 may be bonded along the first side S1 of the heat radiation layer L1, and the respective lateral sides S3 and S4. The second resin layer R2 may be bonded along the second side S2 of the heat radiation layer L1, and the respective lateral sides S3 and S4. The first resin layer R1 and the second resin layer R2 together directly contact an entirety of the lateral sides S1, S2 of the heat radiation layer L1 and there are no additional space between them.

The first resin layer R1 and the second resin layer R2 may completely surround the heat radiation layer L1. The first resin layer R1 and the second resin layer R2 may completely seal the heat radiation layer L1. In an embodiment, the heat radiation layer L1 may be a plate-shaped cuboid, and the first resin layer R1 and the second resin layer R2 may completely surround the heat radiation layer L1.

The ends of the first resin layer R1 and the second resin layer R2 may be bonded to each other. The present specification shows that the first resin layer R1 and the second resin layer R2 including the same material configured as a single layer according to a bonding process. However, embodiments of the present disclosure are not limited thereto and the first resin layer R1 and the second resin layer R2 may be bonded to be separated from each other. In an embodiment, a length of the first resin layer R1 and the second resin layer R2 bonded to each other may be less than or equal to about 1 mm. However, embodiments of the present disclosure are not limited thereto.

The first film layer F1 may be disposed along the edge of the first resin layer R1. For example, the first film layer F1 may be bonded along the first side S1 of the heat radiation layer L1, and the respective lateral sides S3 and S4. The second film layer F2 may be disposed along the edge of the second resin layer R2. The second film layer F2 may be bonded along the second side S2 of the heat radiation layer L1, and the respective lateral sides S3 and S4. In an embodiment, the first film layer F1 may have the same shape as the first resin layer R1, and the second film layer F2 may have the same shape as the second resin layer R2.

The outline of the first resin layer R1 and the second resin layer R2 may have greater planar areas than those of the heat radiation layer L1 (e.g., in a plane defined in the first and second directions DR1, DR2). The outline of the first film layer F1 and the second film layer F2 may have greater planar areas than the heat radiation layer L1. The first resin layer R1 and the second resin layer R2 are positioned between the respective ends of the first film layer F1 and the second film layer F2, and the heat radiation layer L1 may not be positioned between them.

Referring to FIG. 4, the lower sheet LS includes a heat radiation layer L1, a first resin layer R1, a second resin layer R2, a first film layer F1, a second film layer F2, and a releasing layer AD.

According to an embodiment, the thickness of the lateral side of the heat radiation layer L1 may be gradually reduced. The heat radiation layer L1 may include first lateral sides S3-a and S4-a connected to the first side S1, and second lateral sides S3-b and S4-b connected to the second side S2.

The first lateral sides S3-a and S4-a may be inclined with respect to the first side S1, and the second lateral sides S3-b and S4-b may be inclined with respect to the second side S2. Ends of the first lateral sides S3-a and S4-a and the second lateral sides S3-*b* and S4-*b* may be combined to each other. For example, the first lateral side S3-*a* may be bonded to the second lateral side S3-*b* and the first lateral side S4-*a* may be bonded to the second lateral side S4-*b*.

The first resin layer R1 may be bonded along the first side S1 and the first lateral sides S3-*a* and S4-*a*. The second resin layer R2 may be bonded along the second side S2 and the second lateral sides S3-*b* and S4-*b*. The first and second resin layers R1, R2 together directly contact an entirety of the edges of the heat radiation layer L1 and there is no additional space between them. The first resin layer R1 and the second resin layer R2 may completely surround the heat radiation layer L1.

The ends of the first resin layer R1 and the second resin layer R2 may be bonded to each other. The present specification shows that the first resin layer R1 and the second resin layer R2 including the same material and are configured as a single layer according to a bonding process. However, embodiments of the present disclosure are not limited thereto and the first resin layer R1 and the second resin layer R2 may be bonded to be separated from each other. In an embodiment, a length of the first resin layer R1 and the second resin layer R2 bonded to each other may be less than or equal to about 1 mm. However, embodiments of the present disclosure are not limited thereto.

The first film layer F1 may be disposed along the edge of the first resin layer R1. For example, the first film layer F1 may be bonded along the first side S1 of the heat radiation layer L1, and the first lateral sides S3-*a* and S4-*a*. The second film layer F2 may be disposed along the edge of the second resin layer R2. The second film layer F2 may be bonded along the second side S2 of the heat radiation layer L1, and the second lateral side S3-*b* and S4-*b*. In an embodiment, the first film layer F1 may have the same form as the first resin layer R1, and the second film layer F2 may have the same form as the second resin layer R2.

The outline of the first resin layer R1 and the second resin layer R2 may have greater planar areas than the outline of the heat radiation layer L1. The outline of the first film layer F1 and the second film layer F2 may have greater planar areas than the outline of the heat radiation layer L1. The first resin layer R1 and the second resin layer R2 are positioned between the respective ends of the first film layer F1 and the second film layer F2, and the heat radiation layer L1 may not be positioned between them.

Regarding the lower sheet LS according to an embodiment described with reference to FIG. 3 and FIG. 4, as the first and second resin layers R1 and R2 are bonded to an entirety of the edges of the heat radiation layer L1, the separation space therebetween may be removed. For example, an entirety of the edges of the lateral side of the heat radiation layer L1 may be bonded to the first and second resin layers R1 and R2. In a comparative embodiment in which there is an additional space between the heat radiation layer L1 and the first and second resin layers R1 and R2, vapor defects caused by the above-noted process may be generated in the subsequent process performed in the high temperature and the high pressure condition. The space between the heat radiation layer L1 and the first and second resin layers R1 and R2 may work as an internal remaining pressure and may cause vapor defects on the lower sheet LS. However, according to an embodiment of the present disclosure, there is no additional space between the heat radiation layer L1 and the first and second resin layers R1 and R2, so no vapor defects are generated in the subsequent process in the high temperature and high pressure condition, and the lower sheet with increased quality and reliability may be provided.

A method for manufacturing the lower sheet according to embodiments of the present disclosure will be described with reference to FIG. 5 to FIG. 8. FIG. 5, FIG. 6, FIG. 7, and FIG. 8 respectively show a cross-sectional view of a lower sheet according to a manufacturing process according to an embodiment. The previously described contents may be referred to, and a description of similar or identical elements may be omitted for convenience of explanation.

Figure 5:
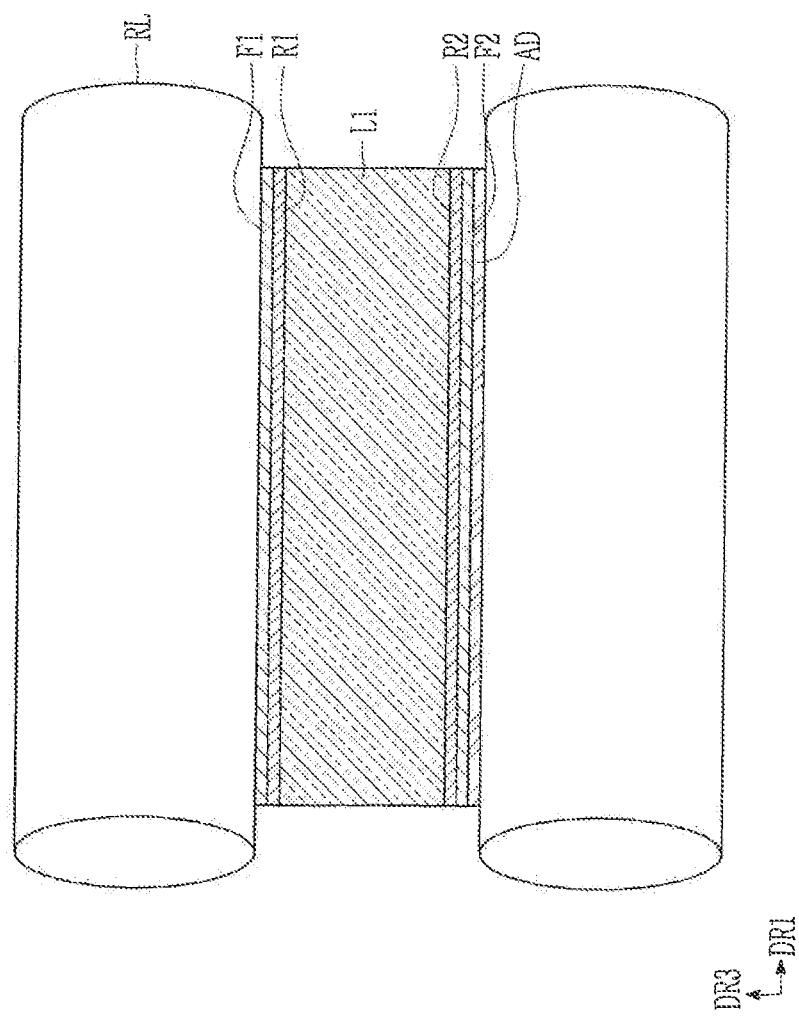
FIGS. 5-8 respectively show a cross-sectional view of manufacturing processes for a lower sheet according to embodiments of the present disclosure.

Referring to FIG. 5, regarding the lower sheet according to an embodiment, the first resin layer R1 and the first film layer F1 are disposed on a first side of the heat radiation layer L1, and the second resin layer R2, the second film layer F2, and the releasing layer AD may be disposed on a second side of the heat radiation layer L1 to thereby manufacture a stacked structure.

In an embodiment, the stacked structure may be inserted into a main roller RL, and may be heated and pressurized to form the first resin layer R1, the first film layer F1, the second resin layer R2, the second film layer F2, and the releasing layer AD adhered to the heat radiation layer L1.

The lower sheet LS shown in FIG. 2 may be manufactured by forming a sealing layer SL on the respective lateral sides of the heat radiation layer L1 by use of a sealing member such as a sealant. The lower sheet LS may be provided in a form in which the sealing layer SL is bonded to an entirety of the lateral sides of the heat radiation layer L1.

Figure 6:
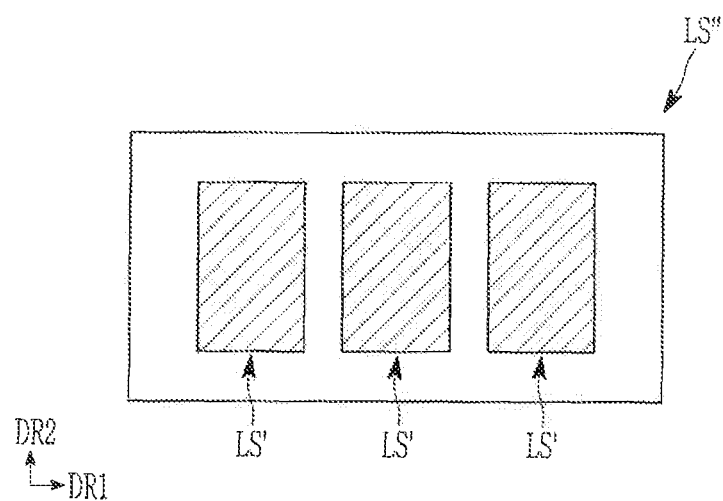

Referring to FIG. 5 and FIG. 6, regarding the lower sheet according to an embodiment, the first resin layer R1 and the first film layer F1 may be disposed on a first side of the heat radiation layer L1, and the second resin layer R2, the second film layer F2, and the releasing layer AD may be disposed on a second side of the heat radiation layer L1 to manufacture a stacked structure in a similar way to what is described with reference to FIG. 5.

The stacked structure may be inserted into a main roller RL, and may be heated and pressurized to form the first resin layer R1, the first film layer F1, the second resin layer R2, the second film layer F2, and the releasing layer AD adhered to the heat radiation layer L1.

The stacked structure LS" manufactured through the main roller RL may be a large sheet. In an embodiment, the large stacked structure LS" may be manufactured into a plurality of stacking sheets LS' by a cutting process. While an embodiment shown in FIG. 6 includes three stacking sheets LS' formed by the cutting process, embodiments of the present disclosure are not limited thereto. Each of the respective stacking sheets LS' include a first resin layer R1, a first film layer F1, a second resin layer R2, a second film layer F2, and a releasing layer AD attached to the heat radiation layer L1.

Regarding the respective stacking sheets LS', the sealing layer SL is formed on the respective lateral sides of the heat radiation layer L1 by using a sealing member such as a sealant to thus manufacture the lower sheet as shown in FIG. 2. The lower sheet LS may be provided when the sealing layer SL is bonded to the heat radiation layer L1.

Further, according to an embodiment, a plurality of sheets below a panel LS may be formed by the cutting process performed after the process is performed once by the main roller (RL). According to the manufacturing process, production efficiency may increase, and precision of a size of the lower sheet may increase.

Regarding the lower sheet LS made according to the manufacturing process described with reference to FIG. 5 and FIG. 6, the sealing layer SL may be bonded to an entirety of the lateral sides of the heat radiation layer L1, and no separation space therebetween may be formed. In comparative embodiments in which there is an additional space between the heat radiation layer L1 and the sealing layer SL, vapor defects caused by the above-noted process may be generated in the subsequent process performed in the high temperature and the high pressure condition. For example, the space between the heat radiation layer L1 and the sealing layer SL may work as an internal remaining pressure and may cause vapor defects on the lower sheet LS. However, according to an embodiment, there is no additional space between the heat radiation layer L1 and the sealing layer SL, so no vapor defects are generated in the subsequent process in the high temperature and high pressure condition, and the sheet disposed below a panel with increased quality and reliability may be provided.

Figure 7:
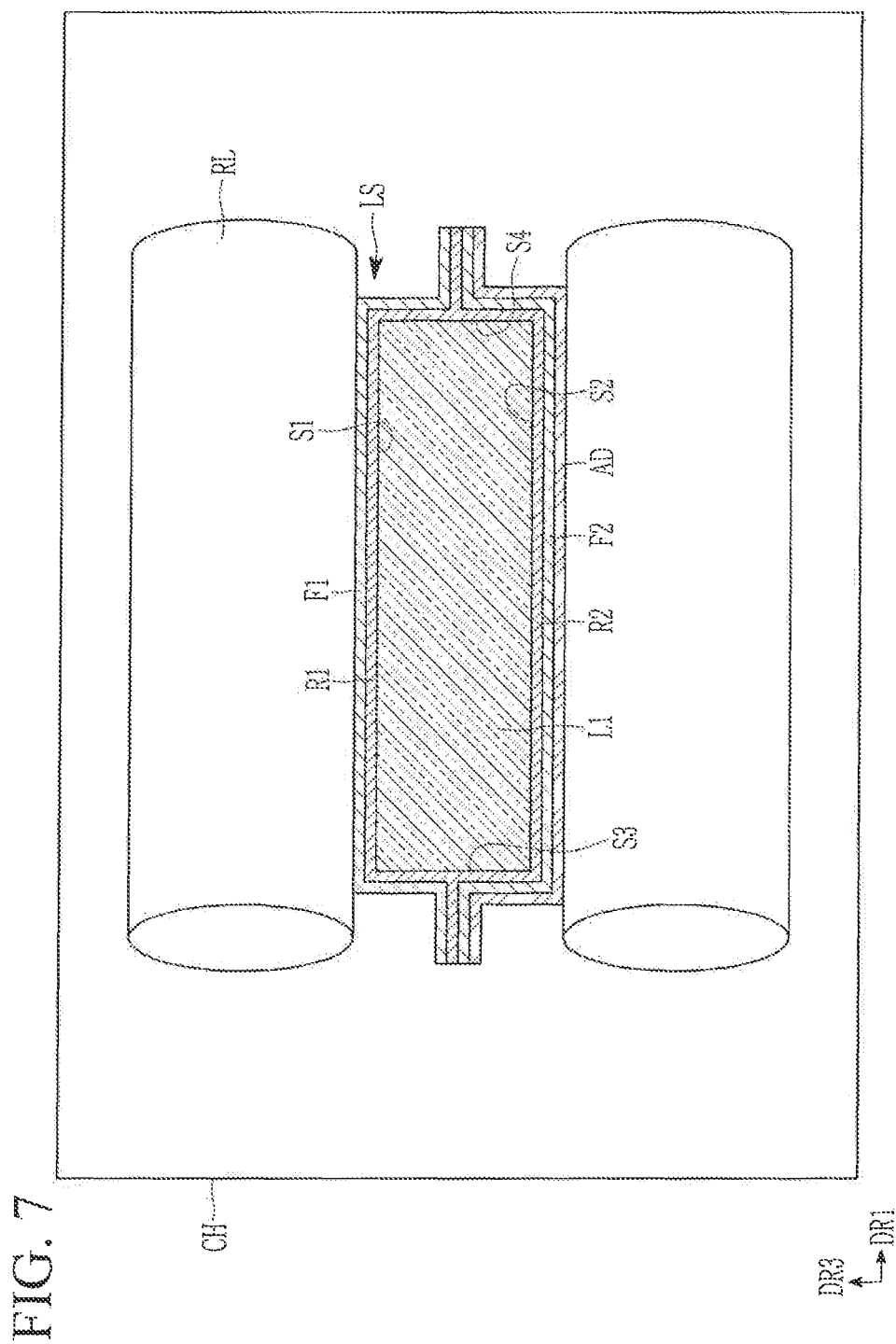

Referring to FIG. 7, the process for manufacturing a lower sheet LS according to an embodiment may be progressed in a vacuous chamber CH.

The first resin layer R1 and the first film layer F1 having outlines having a wider planar area than the heat radiation layer L1 are provided on the first side S1. The second resin layer R2, the second film layer F2, and the releasing layer AD having outlines having a wider planar area than the heat radiation layer L1 are provided on the second side S2.

In an embodiment, the first resin layer R1 and the second resin layer R2 may be bonded on the heat radiation layer L1 in the vacuous chamber CH by using the main roller RL. The vacuous chamber CH may provide a vacuous processing condition. The first resin layer R1 bonded in the vacuous state may be provided while completely bonded to the upper side S1 of the heat radiation layer L1 and the lateral sides S3 and S4. The second resin layer R2 may be completely bonded to a bottom surface S2 of the heat radiation layer L1 and the lateral sides S3 and S4.

Similarly, the first film layer F1 positioned on the first resin layer R1 and the second film layer F2 positioned on the second resin layer R2 may be respectively bonded to the first resin layer R1 and the second resin layer R2 bonded to the heat radiation layer L1.

The ends of the first resin layer R1 and the second resin layer R2 may be bonded to each other. The first resin layer R1 and the second resin layer R2 may be manufactured to seal the heat radiation layer L1, and by this, the lower sheet shown in FIG. 3 may be manufactured.

Figure 8:
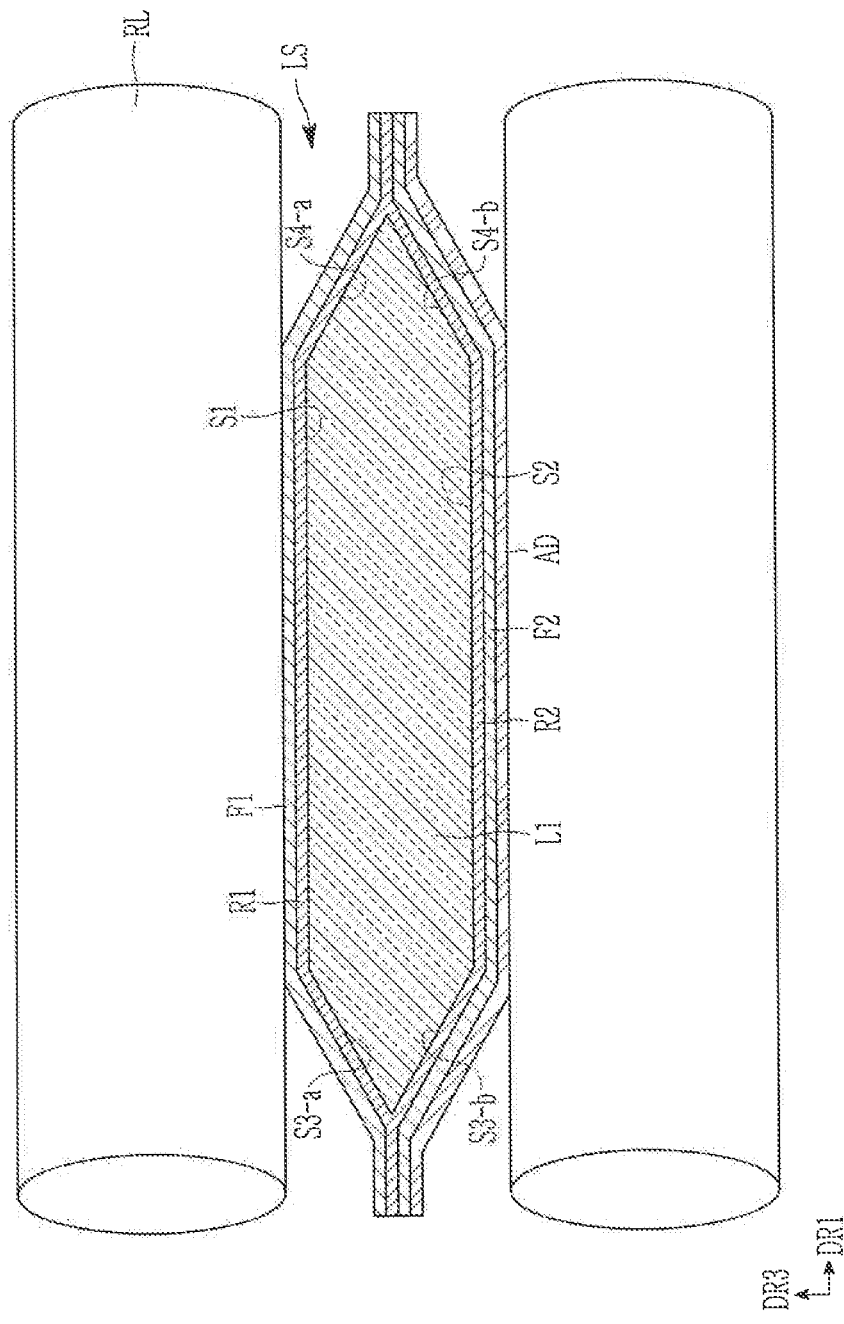

Referring to FIG. 8, regarding the lower sheet according to an embodiment, the first resin layer R1 and the first film layer F1 may be disposed on the first side of the heat radiation layer L1, and the second resin layer R2, the second film layer F2, and the releasing layer AD may be disposed on the second side of the heat radiation layer L1 to manufacture a stacked structure in a similar way to what is described with reference to FIG. 5.

The stacked structure may be inserted into a main roller RL, and may be heated and pressurized to form the first resin layer R1, the first film layer F1, the second resin layer R2, the second film layer F2, and the releasing layer AD adhered to the heat radiation layer L1.

A thickness of the lateral side of the heat radiation layer L1 may be reduced in a direction towards the edge of the lateral side. The first resin layer R1 and the second resin layer R2 provided on the heat radiation layer L1 may together contact an entirety of the lateral side of the heat radiation layer L1. The ends of the first resin layer R1 and the second resin layer R2 may be bonded to each other.

The first film layer F1 and the second film layer F2 may contact an entirety of the lateral sides of the first resin layer R1 and the second resin layer R2.

Regarding the lower sheet LS made by the manufacturing process according to an embodiment described with reference to FIG. 7 and FIG. 8, the resin layers R1 and R2 are bonded to an entirety of the lateral side of the heat radiation layer L1, and no separation space therebetween may be formed. In a comparative embodiment, when there is an additional space between the heat radiation layer L1 and the resin layers R1 and R2, the vapor defects caused by the above-noted process may be generated in the subsequent process performed in the high temperature and the high pressure condition. For example, the space between the heat radiation layer L1 and the resin layers R1 and R2 may work as an internal remaining pressure and may cause vapor defects on the lower sheet LS. However, according to an embodiment, there is no additional space between the heat radiation layer L1 and the resin layers R1 and R2, so no vapor defects are generated in the subsequent process in the high temperature and high pressure condition, and the sheet disposed below a panel with increased quality and reliability may be provided.

While the present disclosure has been described in connection with embodiments thereof, it is to be understood that the invention is not limited to the disclosed embodiments.

What is claimed is:

1. A lower sheet disposed below a display panel, comprising:
    a heat radiation layer having a first side and a second side facing the first side;
    a first film layer disposed on the first side of the heat radiation layer;
    a second film layer disposed on the second side of the heat radiation layer;
    a first resin layer disposed between the heat radiation layer and the first film layer;
    a second resin layer disposed between the heat radiation layer and the second film layer; and
    a sealing layer disposed on lateral sides of the heat radiation layer,
    wherein the sealing layer directly contacts an entirety of the lateral sides of the heat radiation layer, and directly contacts at least a portion of lateral sides of the first resin layer and the second resin layer, and
    wherein the sealing layer directly contacts at least a portion of lateral sides of the first film layer and the second film layer.

2. The lower sheet of claim 1, wherein the heat radiation layer includes graphite.

3. The lower sheet of claim 1, wherein the first film layer and the second film layer include a PET.

4. The lower sheet of claim 1, further comprising a releasing layer disposed on one side of the second film layer.

5. A lower sheet below a display panel, comprising:
    a heat radiation layer including graphite, the heat radiation layer having a first side and a second side facing the first side;
    a first film layer disposed on the first side of the heat radiation layer;
    a second film layer disposed on the second side of the heat radiation layer;
    a first resin layer disposed between the heat radiation layer and the first film layer; and
    a second resin layer disposed between the heat radiation layer and the second film layer, wherein the first resin layer and the second resin layer together directly contact an entirety of lateral sides of the heat radiation layer.

6. The lower sheet of claim 5, wherein the first resin layer and the second resin layer seal the lateral sides of the heat radiation layer.

7. The lower sheet of claim 5, wherein an end of the first resin layer is bonded to an end of the second resin layer.

8. The lower sheet of claim 5, wherein the first resin layer and the second resin layer are bonded along an edge of the heat radiation layer.

9. The lower sheet of claim 5, wherein the first film layer and the second film layer are bonded to the first resin layer and the second resin layer along an edge of the heat radiation layer.

10. The lower sheet of claim 5, wherein the lateral side of the heat radiation layer forms a right angle with an upper side of the heat radiation layer.

11. The lower sheet of claim 5, wherein one lateral side of the lateral sides of the heat radiation layer includes a first lateral side and a second lateral side inclined with respect to an upper side of the heat radiation layer.

12. The lower sheet of claim 5, wherein the first film layer and the second film layer include a PET.

13. A display device comprising:
a display panel; and
a lower sheet overlapping the display panel,
wherein the lower sheet includes
a heat radiation layer including graphite, the heat radiation layer having a first side and a second side facing the first side;
a first film layer disposed on the first side of the heat radiation layer,
a second film layer disposed on the second side of the heat radiation layer,
a first resin layer disposed between the heat radiation layer and the first film layer,
a second resin layer disposed between the heat radiation layer and the second film layer, and
a sealing layer disposed on lateral sides of the heat radiation layer, and the sealing layer directly contacts an entirety of the lateral sides of the heat radiation layer, and directly contacts at least a portion of lateral sides of the first resin layer and the second resin layer,
wherein the sealing layer directly contacts at least a portion of lateral sides of the first film layer and the second film layer.

14. The display device of claim 13, further comprising a releasing layer disposed between one side of the second film layer and the display panel.

15. A display device comprising:
a display panel; and
a lower sheet overlapping the display panel,
wherein the lower sheet includes
a heat radiation layer including graphite, the heat radiation layer having a first side and a second side facing the first side;
a first film layer disposed on the first side of the heat radiation layer;
a second film layer disposed on the second side of the heat radiation layer;
a first resin layer disposed between the heat radiation layer and the first film layer; and
a second resin layer disposed between the heat radiation layer and the second film layer,
the first resin layer and the second resin layer together directly contact an entirety of lateral sides of the heat radiation layer.

16. The display device of claim 15, wherein the first resin layer and the second resin layer seal the lateral sides of the heat radiation layer.

17. The display device of claim 15, wherein the first film layer and the second film layer are bonded along an edge of the heat radiation layer.

18. The display device of claim 15, wherein the lateral sides of the heat radiation layer includes a first lateral side and a second lateral side inclined with respect to an upper side of the heat radiation layer.

* * * * *